(12) United States Patent
Choi et al.

(10) Patent No.: US 9,397,642 B2
(45) Date of Patent: Jul. 19, 2016

(54) LATCH CIRCUIT

(71) Applicant: SK hynix Inc., Gyeonggi-do (KR)

(72) Inventors: Hae-Rang Choi, Gyeonggi-do (KR); Mi-Hyun Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/678,704

(22) Filed: Apr. 3, 2015

(65) Prior Publication Data

US 2016/0164504 A1    Jun. 9, 2016

(30) Foreign Application Priority Data

Dec. 8, 2014  (KR) .......................... 10-2014-0174945

(51) Int. Cl.
*H03K 3/356* (2006.01)

(52) U.S. Cl.
CPC ................................ *H03K 3/356147* (2013.01)

(58) Field of Classification Search
CPC .......................... G11C 11/412; G11C 11/4125
USPC ......... 327/208, 199, 200, 202, 203, 210, 214, 327/219, 223; 326/9, 10, 12, 13
See application file for complete search history.

(56) References Cited

U.S. PATENT DOCUMENTS

| 8,181,074 B2 * | 5/2012 | Tang ................. G11C 11/4125 326/13 |
| 8,384,419 B2 | 2/2013 | Lavery et al. |
| 8,675,398 B2 | 3/2014 | Pedersen |
| 8,797,790 B1 * | 8/2014 | Rahim ................. G11C 11/412 365/156 |

* cited by examiner

*Primary Examiner* — Lincoln Donovan
*Assistant Examiner* — Thomas Skibinski
(74) *Attorney, Agent, or Firm* — IP & T Group LLP

(57) ABSTRACT

A latch circuit includes a first PMOS transistor suitable for pull-up driving a second node based on a voltage of a first node, a first NMOS transistor suitable for pull-down driving the second node based on a voltage of the first node, a second PMOS transistor suitable for pull-up driving the first node based on a voltage of the second node, a second NMOS transistor suitable for pull-down driving the first node based on a voltage of the second node, a first separation element suitable for electrically separating the first NMOS transistor from the second node when the first PMOS transistor is turned on, and a second separation element suitable for electrically separating the second NMOS transistor from the first node when the second PMOS transistor is turned on.

7 Claims, 3 Drawing Sheets

LATCH CIRCUIT

CROSS-REFERENCE TO RELATED APPLICATIONS

The present application claims priority of Korean Patent Application No. 10-2014-0174945, filed on Dec. 8, 2014, which is incorporated herein by reference in its entirety.

BACKGROUND

1. Field

Exemplary embodiments of the present invention relate to a latch circuit.

2. Description of the Related Art

A latch circuit temporarily stores data. Latch circuits are frequently used in all kinds of semiconductor devices. As the degree of integration of a semiconductor device increases, the capacitance value of the storage node of a latch circuit is reduced. This results in an increase in soft errors, where the data stored in the storage node of the latch circuit changes. Soft errors are a phenomenon in which data stored in a latch circuit is altered by a cosmic ray, such as an alpha particle.

FIG. 1 is a diagram illustrating a conventional latch circuit. FIG. 1 shows how a soft error occurs in the conventional latch circuit.

Referring to FIG. 1, the latch circuit includes an inverter INV1 having an NMOS transistor T1 and a PMOS transistor T2 and an inverter INV2 having an NMOS transistor T3 and a PMOS transistor T4. Input/output terminals of the inverters INV1 and INV2 are connected to each other, so that data is retained.

When data having a logic high level 'H' is stored in a node B and data having a logic low level 'L' is stored in a node A, the PMOS transistor T2 and the NMOS transistor T3 are turned on and the NMOS transistor T1 and the PMOS transistor T4 are turned off.

On the other hand, when data having a logic low level is stored in the node B and data having a logic high level 'H' is stored in the node A, the PMOS transistor T2 and the NMOS transistor T3 are turned off and the NMOS transistor T1 and the PMOS transistor T4 are turned on.

The node A may be an input node of the latch circuit and the node B may be an output node of the latch circuit. By a cross-coupled structure, the latch circuit retains data.

In general, soft errors occur when current flows through a turned-off NMOS transistor, which is induced by a cosmic ray. IN contrast, a cosmic ray rarely causes current to flow through a turned-off PMOS transistor. For example, when data having a logic low level 'L' is stored in the node A, due to current flowing through the NMOS transistor T1 caused by a cosmic ray, the voltage of the node B is changed from 'H' to 'L' and the voltage of node A is changed from 'L' to 'H'. That is, data stored in the latch circuit is lost, and a soft error occurs.

SUMMARY

Various embodiments are directed to a latch circuit that is resistant to soft errors.

In an embodiment, a latch circuit may include: a first PMOS transistor that pull-up drives a second node in response to a voltage level of a first node; a first NMOS transistor that pull-down drives the second node in response to the voltage level of the first node; a second PMOS transistor that pull-up drives the first node in response to a voltage level of a second node; a second NMOS transistor that pull-down drives the first node in response to the voltage level of the second node; a first separation element that electrically separates the first NMOS transistor from the second node when the first PMOS transistor is turned on; and a second separation element that electrically separates the second NMOS transistor from the first node when the second PMOS transistor is turned on.

The first separation element and the second separation element may be PMOS transistors, respectively. The latch circuit may further include: a first inverter that employs the first node as input and controls the first separation element by output; and a second inverter that employs the second node as input and controls the second separation element by output.

In another embodiment, a latch circuit may include: a first PMOS transistor that pull-up drives a second node in response to a voltage level of a first node; a first NMOS transistor that pull-down drives a third node in response to the voltage level of the first node; a second PMOS transistor that pull-up drives the first node in response to a voltage level of the second node; a second NMOS transistor that pull-down drives a fourth node in response to the voltage level of the second node; a first separation element that electrically connects the second node to the third node when the first PMOS transistor is turned off, and electrically separates the second node from the third node when the first PMOS transistor is turned on; and a second separation element that electrically connects the first node to the fourth node when the second PMOS transistor is turned off, and electrically separates the first node from the fourth node when the second PMOS transistor is turned on.

The separation element and the second separation element may be PMOS transistors, respectively. The latch circuit may further include: a first inverter that employs the first node as input and controls the first separation element by output; and a second inverter that employs the second node as input and controls the second separation element by output.

In an embodiment, a latch circuit may include: a first transistor suitable for pull-up driving a second node based on a voltage of a first node; a second transistor suitable for pull-down driving the second node based on a voltage of the first node; a third transistor suitable for pull-up driving the first node based on a voltage of the second node; a fourth transistor suitable for pull-down driving the first node based on a voltage of the second node; a fifth transistor suitable for electrically separating the second node from the second transistor when the first transistor is turned on; and a sixth transistor suitable for electrically separating the first node from the fourth transistor when the third transistor is turned on.

DETAILED DESCRIPTION

Figure 1:
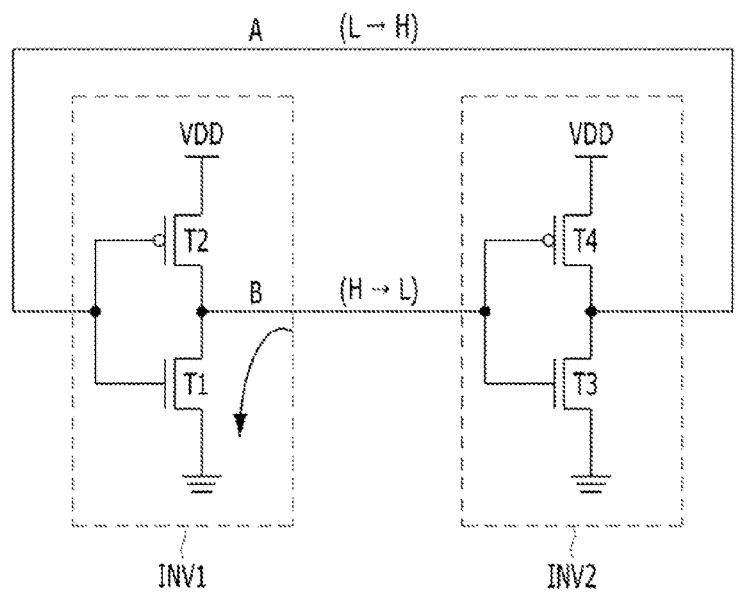
FIG. 1 is a diagram illustrating a conventional latch circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and in some instances, proportions may have been exaggerated in order to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
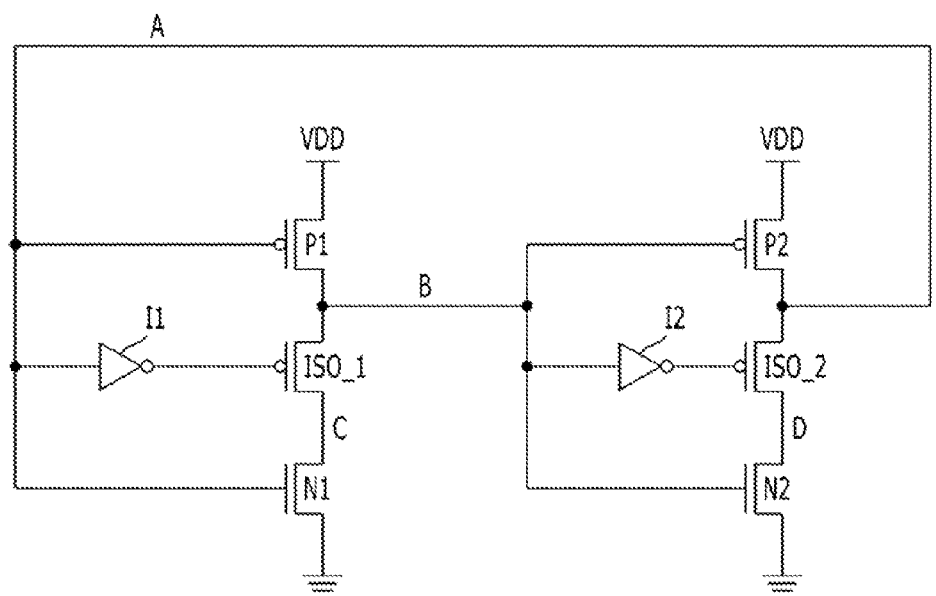
FIG. 2 is a diagram illustrating a latch circuit in accordance with an embodiment of the present invention.

FIG. 2 is a diagram illustrating a latch circuit in accordance with an embodiment of the present invention.

Referring to FIG. 2, the latch circuit may include a first PMOS transistor P1, a first NMOS transistor N1, a second PMOS transistor P2, a second NMOS transistor N2, a first separation element ISO_1, a second separation element ISO_2, a first inverter I1, and a second inverter I2.

The first PMOS transistor P1 may pull-up drive a node B in response to a voltage of a node A. When the node A has a logic low level, the first PMOS transistor P1 may be turned on to drive the node B to a logic high level, and when the node A has a logic high level, the first PMOS transistor P1 may be turned off.

The first NMOS transistor N1 may pull-down drive a node C response to a voltage of the node A. When a voltage of the node A has a logic high level, the first NMOS transistor N1 may be turned on to drive the node C to an 'L' level. In this case, the node C and the node B are electrically connected to each other, so that the first. NMOS transistor N1 may pull-down drive the node B.

The second PMOS transistor P2 may pull-up drive the node A in response to a voltage of the node B. When the node B has a logic low level, the second PMOS transistor P2 may be turned on to drive the node A to a logic high level, and when the node B has a logic high level, the second PMOS transistor P2 may be turned off.

The second NMOS transistor N2 may pull-down drive a node D in response to a voltage of the node B. When the node B has a logic high level, the second NMOS transistor N2 may be turned on to drive the node D to an a logic low level. In this case, the node D and the node A are electrically connected to each other depending on a state of the second separation element ISO_2, so that the second NMOS transistor N2 may pull-down drive the node A.

The first separation element ISO_1 may electrically separate the first NMOS transistor N1 from the node B when the first PMOS transistor P1 is turned on and the first NMOS transistor N1 is turned off. The first separation element ISO_1 may prevent a soft error from occurring in the first NMOS transistor N1. The first separation element ISO_1 may include a PMOS transistor that electrically connects separates the node B to/from the node C in response to the output of the first inverter I1. The first inverter I1 inverts a voltage of the node A.

The second separation element ISO_2 may electrically separate the second NMOS transistor N2 from the node A when the second PMOS transistor P2 is turned on and the second NMOS transistor N2 is turned off. The second separation element ISO_2 may prevent a soft error from occurring in the second NMOS transistor N2. The second separation element ISO_2 ray include a PMOS transistor that electrically connects/separates the node A to/from the node D in response to the output of the second inverter I2. The second inverter I2 inverts a voltage of the node B.

Data stored in the latch circuit may be inputted through the node A and outputted through the node B. Alternatively, the data stored in the latch circuit may be inputted through the node B and outputted through the node A.

Figure 3A:
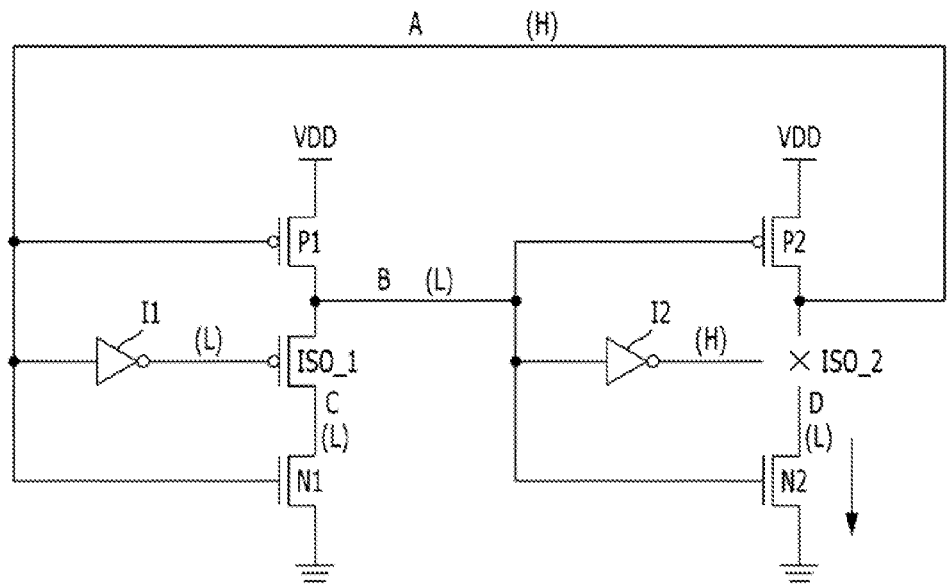
FIGS. 3A and 3B are diagrams for describing an operation of the latch circuit shown in FIG. 2
Figure 3B:
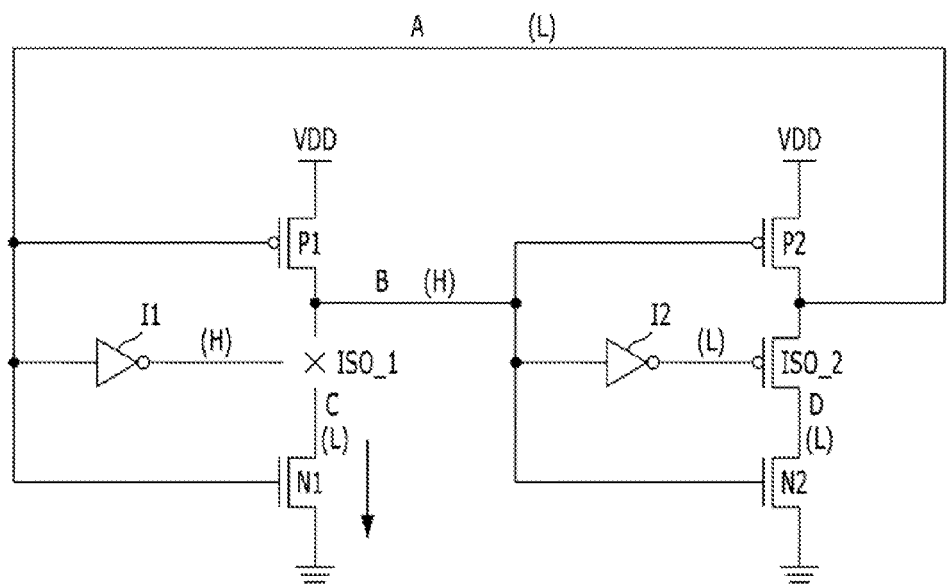

FIGS. 3A and 3B are diagrams for describing an operation of the latch circuit shown in FIG. 2. FIG. 3A shows how a soft error is prevented by the second separation element ISO_2 when data having a logic high level 'H' is stored in the node A of the latch circuit, and FIG. 3B shows how a soft error is prevented by the first separation element ISO_1 when data having a logic low level 'L' is stored in the node A of the latch circuit.

Referring to FIG. 3A, when 'H' data is stored in the node A of the latch circuit (i.e., the second node B has a logic low level 'L') the first NMOS transistor N1, the second PMOS transistor P2, and the first separation element ISO_1 may be turned on. The first PMOS transistor P1, the second NMOS transistor N2, and the second separation element ISO_2 may be turned off. Soft errors occur when a current flows, due to a cosmic ray, through the second NMOS transistor N2 that is turned off. However, even though current flows through the second NMOS transistor N2, since the second NMOS transistor N2 is electrically separated from the node A by the second separation element ISO_2, the voltage of the node A does not vary. Accordingly, no change may occur in the data stored in the latch circuit. That is, even though leakage current flows through the second NMOS transistor N2, since the second separation element ISO_2 substantially prevents a change in the data due to leakage current, a soft error may be avoided.

Referring to FIG. 3B, when 'L' data is stored in the node A of the latch circuit (i.e., the second node B has a logic high level 'H'), the first PMOS transistor P1, the second NMOS transistor N2, and the second separation element ISO_2 may be turned on. The first NMOS transistor N1, the second PMOS transistor P2, and the first separation element ISO_1 may be turned off. The soft error occurs when a current flows, due to a cosmic ray, through the first NMOS transistor N1 that is to be turned off. However, even though current flows through the first NMOS transistor N1, since the first NMOS transistor N1 is electrically separated from the node B by the first separation element ISO_1, the voltage of node B does not vary. Accordingly, the data stored in the latch circuit may remain the same. That is, even though leakage current flows through the first NMOS transistor N1, since the first separation element. ISO_1 prevents a change in the data due to leakage current, a soft error may be avoided.

Figure 4:
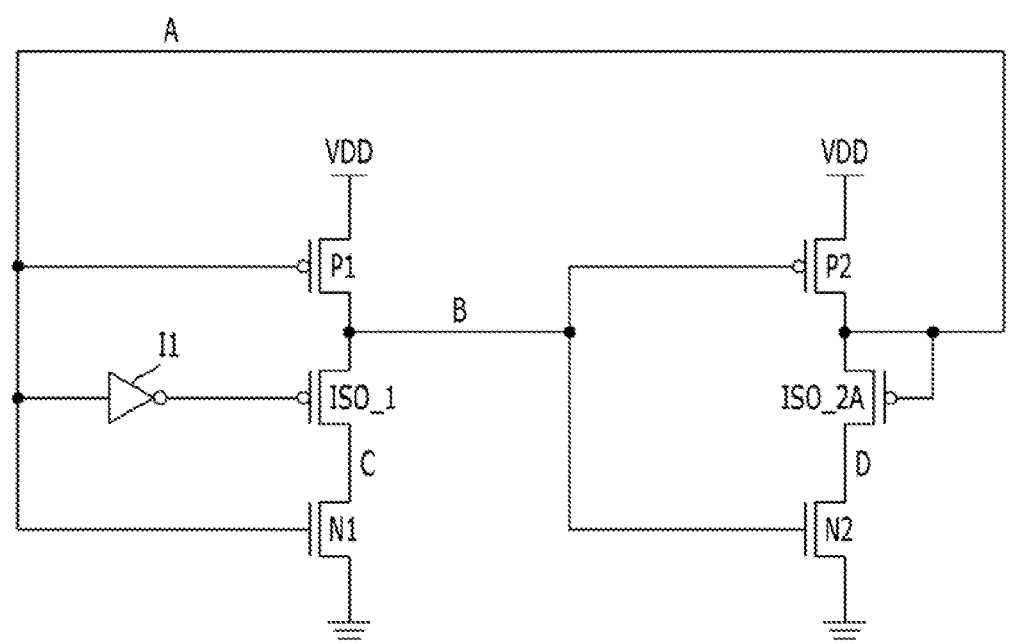
FIG. 4 is a diagram illustrating a latch circuit in accordance with an embodiment of the present invention.

FIG. 4 is a diagram illustrating a latch circuit in accordance with an embodiment of the present invention The embodiment shown in FIG. 4 is different from the embodiment shown in FIG. 2 in that the second inverter I2 for controlling the second separation element ISO_2A is omitted and the second separation element ISO_2A is controlled by a voltage of the node A. In contrast to the embodiment shown in FIG. 4, the first inverter I1 may be omitted instead of the second inverter I2 and the first separation element ISO_1 may be controlled by the node B.

Furthermore, it may be possible that the inverters I1 and I2 for controlling the separation elements ISO_1 and ISO_2 are not used and signals for controlling the separation elements ISO_1 and ISO_2 may be generated and inputted from outside of the latch circuit.

In accordance with embodiments of the present invention, a latch circuit may be resistant to soft errors.

Although various embodiments have been described for illustrative purposes, it will be apparent to those skilled in the art that various changes and modifications may be made without departing from the spirit and scope of the invention as defined in the following claims.

What is claimed is:

1. A latch circuit comprising:
a first PMOS transistor suitable for pull-up driving a second node based on a voltage of a first node;
a first NMOS transistor suitable for pull-down driving the second node based on a voltage of the first node;
a second PMOS transistor suitable for pull-up driving the first node based on a voltage of the second node;
a second NMOS transistor suitable for pull-down driving the first node based on a voltage of the second node;
a first separation element suitable for electrically separating the first NMOS transistor from the second node when the first PMOS transistor is turned on; and
a second separation element suitable for electrically separating the second NMOS transistor from the first node when the second PMOS transistor is turned on,
wherein the first separation element and the second separation element include a PMOS transistor, respectively.

2. The latch circuit of claim 1, further comprising:
a first inverter suitable for inverting a voltage of the first node to control the first separation element; and
a second inverter suitable for inverting a voltage of the second node to control the second separation element.

3. The latch circuit of claim 1, further comprising:
a first inverter suitable for inverting a voltage of the first node to control the first separation element,
wherein the second separation element is controlled by a voltage of the first node.

4. A latch circuit comprising:
a first PMOS transistor suitable for pull-up driving a second node based on a voltage of a first node;
a first NMOS transistor suitable for pull-down driving a third node based on a voltage of the first node;
a second PMOS transistor suitable for pull-up driving the first node based on a voltage of the second node;
a second NMOS transistor suitable for pull-down driving a fourth node based on a voltage of the second node;
a first separation element suitable for electrically connecting the second node to the third node when the first PMOS transistor is turned off, and electrically separating the second node from the third node when the first PMOS transistor is turned on; and
a second separation element suitable for electrically connecting the first node to the fourth node when the second PMOS transistor is turned off, and electrically separating the first node from the fourth node when the second PMOS transistor is turned on,
wherein the first separation element and the second separation element include a PMOS transistor, respectively.

5. The latch circuit of claim 4, further comprising:
a first inverter suitable for inverting a voltage the first node to control the first separation element; and
a second inverter suitable for inverting a voltage the second node to control the second separation element.

6. The latch circuit of claim 4, further comprising:
a first inverter suitable for inverting a voltage the first node to control the first separation element,
wherein the second separation element is controlled by a voltage of the first node.

7. A latch circuit comprising:
a first transistor suitable for pull-up driving a second node based on a voltage of a first node;
a second transistor suitable for pull-down driving the second node based on a voltage of the first node;
a third transistor suitable for pull-up driving the first node based on a voltage of the second node;
a fourth transistor suitable for pull-down driving the first node based on a voltage of the second node;
a fifth transistor suitable for electrically separating the second node from the second transistor when the first transistor is turned on;
a sixth transistor suitable for electrically separating the first node from the fourth transistor when the third transistor is turned on;
a first inverter suitable for inverting a voltage of the first node to control the fifth transistor; and
a second inverter suitable for inverting a voltage of the second node to control the sixth transistor.

* * * * *